(12) United States Patent
Yoshimi et al.

(10) Patent No.: US 6,200,825 B1
(45) Date of Patent: Mar. 13, 2001

(54) METHOD OF MANUFACTURING SILICON BASED THIN FILM PHOTOELECTRIC CONVERSION DEVICE

(75) Inventors: Masashi Yoshimi, Kobe; Yoshifumi Okamoto, Otsu; Kenji Yamamoto, Kobe, all of (JP)

(73) Assignee: Kaneka Corporation, Osaka (JP)

(*) Notice: Subject to any disclaimer, the term of this patent is extended or adjusted under 35 U.S.C. 154(b) by 0 days.

(21) Appl. No.: 09/390,083

(22) Filed: Sep. 3, 1999

(30) Foreign Application Priority Data

Feb. 26, 1999 (JP) .................................. 11-050149
Feb. 26, 1999 (JP) .................................. 11-050248

(51) Int. Cl.[7] ............................................ H01L 21/00
(52) U.S. Cl. .................................... 438/24; 438/22
(58) Field of Search ....................................... 438/22, 24

(56) References Cited

U.S. PATENT DOCUMENTS 4,875,944 * 10/1989 Yoshida .......................... 136/249
5,336,623 * 8/1994 Sichanugrist .
5,456,762 * 10/1995 Kariya et al. ........................ 136/258

* cited by examiner

Primary Examiner—Long Pham
(74) Attorney, Agent, or Firm—Hogan & Hartson, LLP

(57) ABSTRACT

A p type semiconductor layer, an i type crystalline (polycrystalline, microcrystalline) photoelectric conversion layer, and an n type semiconductor layer are successively formed in the same plasma CVD deposition chamber. The p type semiconductor layer is produced on condition that the pressure in the deposition chamber is at least 5 Torr. Accordingly, a silicon-based thin film photoelectric conversion device having the p type semiconductor layer, the i type crystalline photoelectric conversion layer, and the n type semiconductor layer stacked on each other is manufactured. A method of manufacturing a silicon-based thin film photoelectric conversion device is thus implemented to produce a photoelectric conversion device having a superior performance and quality by a simple apparatus at a low cost and with high productivity.

6 Claims, 4 Drawing Sheets

METHOD OF MANUFACTURING SILICON BASED THIN FILM PHOTOELECTRIC CONVERSION DEVICE

BACKGROUND OF THE INVENTION

1. Field of the Invention

The present invention relates to a method of manufacturing a silicon-based thin film photoelectric conversion device, and particularly to a manufacturing method thereof to achieve a superior performance as the silicon-based thin film photoelectric conversion device as well as improved cost and efficiency in production.

In the specification, the terms "polycrystalline," "microcrystalline" and "crystalline" refer not only to perfect crystalline state but also a state partially involving amorphous state.

2. Description of the Background Art

In recent years a photoelectric conversion device employing a thin film containing crystalline silicon such as polycrystalline silicon, mycrocrystalline silicon, has been increasingly developed. It has been developed in attempting to reduce the cost of the photoelectric conversion device and also enhance the performance of the same by forming a crystalline silicon thin film of good quality on an inexpensive substrate through a process at a low temperature, and such development is expected to be applied to a variety of photoelectric conversion devices, such as optical sensors other than solar cells.

Conventionally, as an apparatus for producing a solar cell, an in-line system apparatus in which a plurality of film deposition chambers (or simply referred to as chambers) are coupled in line as shown in the block diagram of FIG. 4, or a multi-chamber system apparatus in which a plurality of deposition chambers are arranged around a central middle chamber as shown in the block diagram of FIG. 5, has been employed.

For an amorphous silicon solar cell, a single chamber system in which all semiconductor layers are formed in one and the same deposition chamber has been used as a simple method. In order to prevent conductivity type determining impurity atoms doped in a p type semiconductor layer and an n type semiconductor layer from being undesirably mixed to a semiconductor layer of a different type, however, it is necessary to sufficiently replace gas in the deposition chamber before forming respective semiconductor layers, for example, by gas replacement for one hour using purge gas, such as hydrogen. Even when such a gas replacement process is performed, it has been impossible to attain superior performance of the amorphous silicon solar cell. Therefore, the single chamber system has been used only for experimental purpose.

Manufacturing of an nip type solar cell by successively depositing an n type semiconductor layer, an i type photoelectric conversion layer and a p type semiconductor layer in this order from the side of the substrate using the aforementioned in-line or multi-chamber system will be described in the following.

In the in-line system shown in FIG. 4, a structure is used in which an n layer deposition chamber $3n$ for forming the n type semiconductor layer, i layer deposition chambers $3i_1$ to $3i_6$ for forming the i type photoelectric conversion layer and a p layer deposition chamber $3p$ for forming the p type semiconductor layer are coupled in order. Here, as the n type semiconductor layer and the p type semiconductor layer are thinner than the i type photoelectric conversion layer, film deposition time for these layers is significantly shorter. For this reason, in order to improve production efficiency, a plurality of i layer deposition chambers are generally coupled, and until the film deposition time of the n and p type semiconductor layers attain a rate regulating state, the larger the number of i layer deposition chambers, the higher the productivity.

In the multi-chamber system shown in FIG. 5, a substrate on which films are to be deposited is moved to respective deposition chambers $4n$, $4i_1$ to $4i_4$ and $4p$ through a middle chamber $4m$.

The in-line system as described above disadvantageously includes a plurality of i layer deposition chambers $3i_1$ to $3i_6$ which require maintenance most. Therefore, even if maintenance of only one i layer deposition chamber is required, it is necessary to stop the entire production line.

By contrast, in the multi-chamber system as shown in FIG. 5, a movable partition capable of maintaining airtightness between each of the deposition chambers $4n$, $4i_1$ to $4i_4$ and $4p$ and the middle chamber $4m$ is provided. Therefore, even when there is a failure in one deposition chamber, other deposition chambers are available, and therefore overall production halt can be avoided.

The multi-chamber production system, however, has a mechanism for moving the substrate between each of the deposition chambers $4n$, $4i_1$ to $4i_4$ and $4p$ and middle chamber $4m$ while maintaining air-tightness which is complicated and expensive, and further, the number of deposition chambers arranged around middle chamber $4m$ is limited by space. Therefore, the production apparatus of this type is not widely used for actual production.

SUMMARY OF THE INVENTION

The present invention was made in order to solve the problems above. One object of the present invention is to provide a method of manufacturing a silicon-based thin film photoelectric conversion device to allow a photoelectric conversion device having excellent performance and quality to be produced at a low cost with high efficiency by using a simple apparatus.

According to the method of manufacturing a silicon-based thin film photoelectric conversion device of the invention, a silicon-based thin film photoelectric conversion device having a stacked structure composed of a p type semiconductor layer, an i type crystalline silicon-based photoelectric conversion layer, and an n type semiconductor layer is fabricated by plasma CVD. This method is characterized in that the p type semiconductor layer, the i type crystalline silicon-based photoelectric conversion layer, and the n type semiconductor layer are successively produced in the same plasma CVD reaction chamber and that the p type semiconductor layer is formed on condition that the pressure in the reaction chamber is at least 5 Torr.

The inventors have found that when p, i and n layers are formed in this order in one reaction chamber and the pressure in the reaction chamber when the p type semiconductor layer is formed is set as high as 5 Torr or higher, a photoelectric conversion device having superior quality and high performance can be obtained. Details are as follows.

As the p, i and n layers are formed in this order, mixing of the conductivity type determining impurity atoms into the i type photoelectric conversion layer is reduced than when n, i and p layers are formed in this order. This is because the p type impurity atoms (for example, boron atoms) are harder to be diffused as compared with n type impurity atoms (for example, phosphorus atoms). More specifically, the p type impurity atoms adhered on an inner wall surface of the reaction chamber or on a plasma discharge electrode while forming the p type semiconductor layer do diffuse into the i type photoelectric conversion layer when the i type photoelectric conversion layer is formed. The extent of diffusion, however, is smaller than the n type impurity atoms. Therefore, mixture or entrance to the i type photoelectric conversion layer is suppressed.

Further, as the p type semiconductor layer is formed under a high pressure condition of 5 Torr or higher, film deposition rate of the p type semiconductor layer is high, and therefore it becomes possible to complete formation of the p type semiconductor layer in a short period of time. Accordingly, the time necessary for introducing raw material gas for forming the p type semiconductor layer into the reaction chamber can be shortened, and hence accumulation of p type impurity atoms adhered on the electrode of the reaction chamber, for example, can be suppressed. This further suppresses mixture or entrance of p type impurity atoms into the i type photoelectric conversion layer.

From the foregoing, even when the photoelectric conversion device is manufactured by the single chamber system, mixture of the conductivity type determining impurity atoms into the i type photoelectric conversion layer can be suppressed to a large extent. Therefore, a photoelectric conversion device of superior quality and performance comparable to the photoelectric conversion device manufactured through the in-line system or the multi-chamber system can be obtained.

Further, as the device can be manufactured by the single chamber system, the facility can be simplified as compared with the in-line system or the multi-chamber system.

Further, as formation of the p type semiconductor layer can be completed in a short period of time, the tact time for manufacturing can be significantly reduced, which, together with the simplified facility, reduces the manufacturing cost.

In the method of manufacturing a silicon-based thin film photoelectric conversion device described above, preferably the p type semiconductor layer, the i type crystalline silicon-based photoelectric conversion layer, and the n type semiconductor layer are formed respectively to the thicknesses ranging from 2 nm to 50 nm, 0.5 µm to 20 µm, and 2 nm to 50 nm.

Accordingly, deposition of the p type and n type semiconductor layers can be completed in a short period of time, and the i type photoelectric conversion layer having a necessary and sufficient thickness can be produced as a crystalline-containing silicon-based thin film photoelectric conversion layer.

In the method of manufacturing a silicon-based thin film photoelectric conversion device, the film deposition rate of the p type semiconductor layer is preferably at least 12 nm/min.

The film deposition rate of the p type semiconductor layer is thus enhanced to reduce the deposition time as well as the manufacturing cost.

In the method of manufacturing a silicon-based thin film photoelectric conversion device, the p type semiconductor layer is preferably deposited on conditions that the temperature of an underlayer is 550° C. or less, silane-type gas as a main component of raw material gas which is supplied into the reaction chamber as well as dilution gas containing hydrogen are used, and the flow rate of the dilution gas is at least 100 times higher than that of the silane-type gas.

The temperature of the underlayer is defined to be 550° C. or less so as to allow a low cost material such as glass to be used as a substrate. Further, the flow rate of the dilution gas is defined to be at least 100 times higher than that of the silane-type gas to achieve a predetermined crystallized fraction when the p type semiconductor layer is deposited under the pressure condition of at least 5 Torr.

In the method of manufacturing a silicon-based thin film photoelectric conversion device, the conductivity type determining impurity atom of the p type semiconductor layer is preferably boron or aluminum.

P type impurity atoms can thus be selected appropriately.

In the method of manufacturing a silicon-based thin film photoelectric conversion device, preferably the i type crystalline silicon-based photoelectric conversion layer and the n type semiconductor layer are formed on conditions that the pressure in the reaction chamber is at least 5 Torr, the film deposition rate is at least 12 nm/min, the temperature of an underlayer is 550° C. or less, and the flow rate of the dilution gas is at least 100 times higher than that of silane-type gas.

Accordingly, in the fabrication of the i type photoelectric conversion layer and the n type semiconductor layer, the same effect as that of the p type semiconductor layer as described above is achieved.

In the method of manufacturing a silicon-based thin film photoelectric conversion device, in addition to at least one photoelectric conversion unit including the crystalline silicon-based photoelectric conversion layer, at least one photoelectric conversion unit including an amorphous silicon-based photoelectric conversion layer is preferably deposited to implement a tandem type photoelectric conversion device.

A tandem type photoelectric conversion device having a high photoelectric conversion efficiency is thus obtained.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are hereinafter described in conjunction with the drawings.

Figure 1:
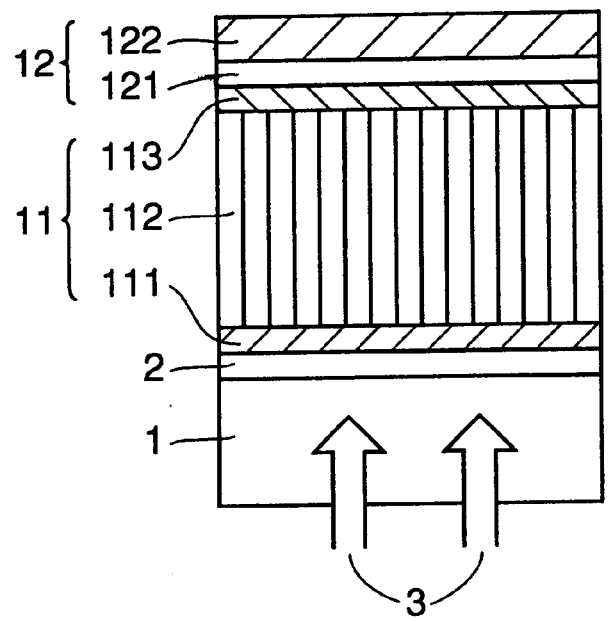
FIG. 1 is a schematic cross sectional view illustrating a structure of a silicon-based thin film photoelectric conversion device manufactured according to a method in one embodiment of the invention.

Referring to FIG. 1, a transparent conducting film 2 is deposited on a transparent substrate 1 formed of glass, for example. Transparent is conducting film 2 is formed of $SnO_2$, for example. Instead, it may be formed of a transparent conductive oxide film such as ITO and ZnO.

Figure 2:
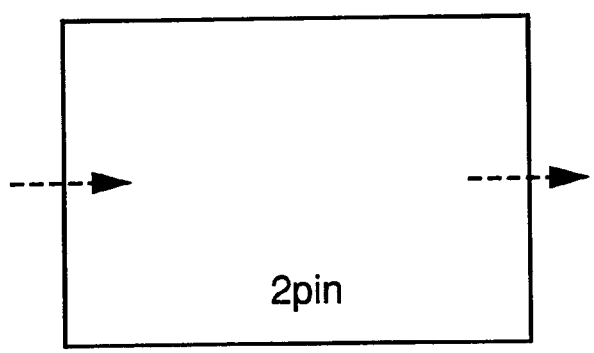
FIG. 2 is a block diagram illustrating a plasma CVD apparatus employed in the method of manufacturing a silicon-based thin film photoelectric conversion device in the embodiment of the invention.

Substrate 1 is then delivered into a deposition chamber 2pin shown in FIG. 2. In deposition chamber 2pin, a p type semiconductor layer 111 is first deposited on transparent conducting film 2 by plasma CVD. Preferably, p type semiconductor layer 111 is formed on conditions that the pressure in deposition chamber 2pin is at least 5 Torr, the film deposition rate is at least 12 nm/min, and the temperature of an underlayer is 550° C. or less to have a thickness ranging from 2 nm to 50 nm. Still preferably, silane-type gas (e.g. silane) as a main component of raw material gas which is supplied into deposition chamber 2pin and dilution gas containing hydrogen (e.g. hydrogen) are used, the flow rate of the dilution gas is at least 100 times higher than that of the silane-type gas, and diborane is employed as doping gas.

As p type semiconductor layer 111, a p type amorphous silicon thin film doped with at least 0.01 atomic % of boron, for example, which is a conductivity type determining impurity atom may be used. However, the conditions concerning p type semiconductor layer 111 are not limitations. For example, aluminum may be employed as impurity atom, or any layer of alloy material such as amorphous silicon carbide and amorphous silicon germanium may be used. The thickness of p type semiconductor layer 111 is preferably in the range of 2 nm to 10 nm. It is noted that p type semiconductor layer 111 is not limited to an amorphous thin film, and thus a microcrystalline silicon-based thin film or alloy-based thin film may be used as p type semiconductor layer 111. In addition, p type semiconductor layer 111 may be formed of a plurality of different thin films deposited on each other.

Following the formation of p type semiconductor layer 111, an i type crystalline (polycrystalline, microcrystalline) silicon-based photoelectric conversion layer 112 and an n type semiconductor layer 113 are successively deposited on p type semiconductor layer 111 in the same deposition chamber 2pin by plasma CVD. Preferably, i type crystalline silicon-based photoelectric conversion layer 112 is formed to a thickness ranging from 0.5 µm to 20 µm and n type semiconductor layer 113 is formed to a thickness ranging from 2 nm to 50 nm.

As i type photoelectric conversion layer 112, a non-doped i type polycrystalline silicon thin film, an i type microcrystalline silicon thin film with crystallized volume fraction of at least 80%, or a crystalline silicon-based thin film of weak p or n type containing a slight amount of impurities that has a sufficient photoelectric conversion function may be employed. Preferably, crystalline photoelectric conversion layer 112 has (110) preferential crystal orientation planes in parallel with its surface, and the intensity ratio of (111) diffraction peaks relative to (220) diffraction peaks in X-ray diffraction is ⅕ or less. However, photoelectric conversion layer 112 is not limited to them, and alloy material such as silicon carbide and silicon germanium may be used instead.

As n type semiconductor layer 113, for example, an n type microcrystalline silicon-based thin film doped with at least 0.01 atomic % of phosphorus which is conductivity type determining impurity atom may be used. However, the conditions regarding n type semiconductor layer 113 are not limitations and a layer of alloy material such as microcrystalline silicon carbide or microcrystalline silicon germanium may be employed. The thickness of n type semiconductor layer 113 is more preferably in the range of 5 nm to 30 nm.

Preferably, i type photoelectric conversion layer 112 and n type semiconductor layer 113 are formed on conditions that the pressure in deposition chamber 2pin is at least 5 Torr, the film deposition rate is at least 12 nm/min, the temperature of an underlayer is 550° C. or less, and the flow rate of dilution gas (e.g. hydrogen) is at least 100 times higher than that of silane-type gas (e.g. silane). Phosphine is preferably used as doping gas for producing n type semiconductor layer 113, for example.

Deposition chamber 2pin may be cleaned by flowing purge gas such as hydrogen gas into deposition chamber 2pin after a new substrate is supplied into deposition chamber 2pin and immediately before forming p type semiconductor layer 111 and immediately before forming i type photoelectric conversion layer 112. In this case, if the cleaning time is too long, the productivity is accordingly deteriorated. Therefore, the cleaning time is preferably within 20 minutes.

In this way, a crystalline type photoelectric conversion unit 11 is fabricated of p type semiconductor layer 111, i type photoelectric conversion layer 112, and n type semiconductor layer 113 that are successively deposited in the same deposition chamber 2pin.

On this photoelectric conversion unit 11, a conducting film 121 formed of ZnO for example and a metallic thin film 122 formed of Ag for example are formed. These films 121 and 122 constitute a backside electrode portion 12 and accordingly, the photoelectric conversion device shown in FIG. 1 is completed.

Although i-type photoelectric conversion layer 112 can be formed under the conditions described above, Method A below may be employed for producing the layer 112.

Method A includes the first step of depositing by the vapor deposition method, on a substrate at a temperature of 400° C. or less, a silicon thin layer which at least partially contains an amorphous portion, and the second step of exposing the silicon thin layer on the substrate at 400° C. or less to hydrogen plasma of at least 3 Torr to crystallize the amorphous portion contained in the silicon thin layer. The first and second steps are repeated a desired number of times.

The thickness of the silicon thin layer deposited by performing the first step once can be at least 300 nm.

The time for exposing the silicon thin layer to the hydrogen plasma in performing the second step once can be set as 10 seconds or less.

In the first step, the silicon thin layer is preferably deposited by plasma CVD.

According to the exemplary method above, a silicon thin layer which at least partially contains an amorphous portion is first deposited on a substrate at 400° C. or less by the vapor deposition method such as the known CVD and PVD. The silicon thin layer is deposited on the substrate at 400° C. or less in order to use an inexpensive blue sheet glass having a low softening temperature as a substrate. As the vapor deposition method, any method may be employed if the method allows the amorphous silicon thin layer to be deposited on a substrate of 400° C. or less. Plasma CVD, for example, may employed as CVD, and sputtering may be employed as PVD, for example.

The amorphous silicon thin layer thus has undergone vapor deposition is then exposed to hydrogen plasma generated under a relatively high pressure condition of at least 3 Torr. By exposing the amorphous silicon thin layer to the high pressure hydrogen plasma of at least 3 Torr, a sufficient crystallization to the depth of about 1000 nm from the surface is possible. However, as the thickness of the amorphous silicon thin layer increases, the layer is exposed to the hydrogen plasma for a longer period of time for crystallization thereof. Therefore, the thickness is preferably 500 nm or less, and the exposure time of 10 seconds or less is enough in this case. On the contrary, if the amorphous silicon thin layer is thinner, the deposition of the thin layer and exposure thereof to the hydrogen plasma should be repeated many times in order to produce a crystalline silicon film of a desired thickness. The thickness is therefore preferably at least 300 nm.

In fabricating a crystalline silicon thin film according to Method A, a silicon thin layer having a considerably greater thickness relative to any conventional layer can be crystallized in a short time exposure to hydrogen plasma of relatively high pressure. Accordingly, in order to obtain a crystalline silicon film of a desired thickness, deposition of the amorphous silicon thin layer and exposure thereof to the hydrogen plasma for a short period of time may just be repeated a far fewer times relative to any conventional method. As a result, the productivity of the crystalline silicon thin film is improved remarkably, and undesirable damage to the silicon film due to the hydrogen plasma can be reduced since the crystallization process is performed in hydrogen plasma of higher pressure than the conventional method.

Method A for fabricating a crystalline silicon thin film is a general crystallization method which is applicable to a method of manufacturing a silicon-based thin film photoelectric conversion device other than the manufacturing method of the invention.

In this embodiment, p type semiconductor layer 111, i type photoelectric conversion layer 112, and n type semiconductor layer 113 are formed in this order in the same deposition chamber 2pin, and the pressure in deposition chamber 2pin is made high as being at least 5 Torr when p type semiconductor layer 111 is formed. Owing to this, a photoelectric conversion device having a superior quality and performance can be obtained. Details are given in the following.

If n, i and p layers are formed in this order in the same deposition chamber, n type impurity atoms attach to and remain on an inner wall surface and a plasma discharge electrode of the deposition chamber when the n type semiconductor layer is formed. As a result, when the i type photoelectric conversion layer is fabricated, it is considered that the remaining n type impurity atoms are mixed into or enter the i type photoelectric conversion layer.

If the p, i and n layers are deposited in this order according to this embodiment, p type impurity atoms attach to and remain on the inner wall surface and the plasma discharge electrode of the deposition chamber when p type semiconductor layer 111 is formed. However, the p type impurity atoms are harder to be diffused as compared with the n type impurity atoms. Therefore, the amount of p type impurity atoms diffusing into i type photoelectric conversion layer 112 is significantly smaller than that of n type ones and accordingly the amount of the p type impurity atoms entering i type photoelectric conversion layer 112 would be decreased.

As p type semiconductor layer 111 is fabricated on a high pressure condition of at least 5 Torr, the film deposition rate of p type semiconductor layer 111 can be enhanced to complete deposition of p type semiconductor layer 111 in a short period of time. Accordingly, the time required for supplying the gas for fabricating p type semiconductor layer 111 into deposition chamber 2pin can be reduced to avoid accumulation of p type impurity atoms attaching to the inner surface and the plasma discharge electrode of deposition chamber 2pin. Consequently, mixture of p type impurities into i type photoelectric conversion layer 112 formed in the subsequent step can be suppressed.

As discussed above, even if the photoelectric conversion device is produced according to the single chamber system, it is possible to remarkably decrease p type impurity atoms entering i type photoelectric conversion layer 112. Consequently, a photoelectric conversion device having an excellent quality and performance similar to that of a photoelectric conversion device produced according to the in-line system or the multi-chamber system can be produced.

Further, the single chamber system can be employed for manufacturing the device, the facility for it can be simplified as compared with the in-line or multi-chamber system.

In addition, p type semiconductor layer 111 can be completed in a short period of time, so that the tact time for manufacture can be decreased remarkably, and the manufacturing cost can be reduced.

Figure 3:
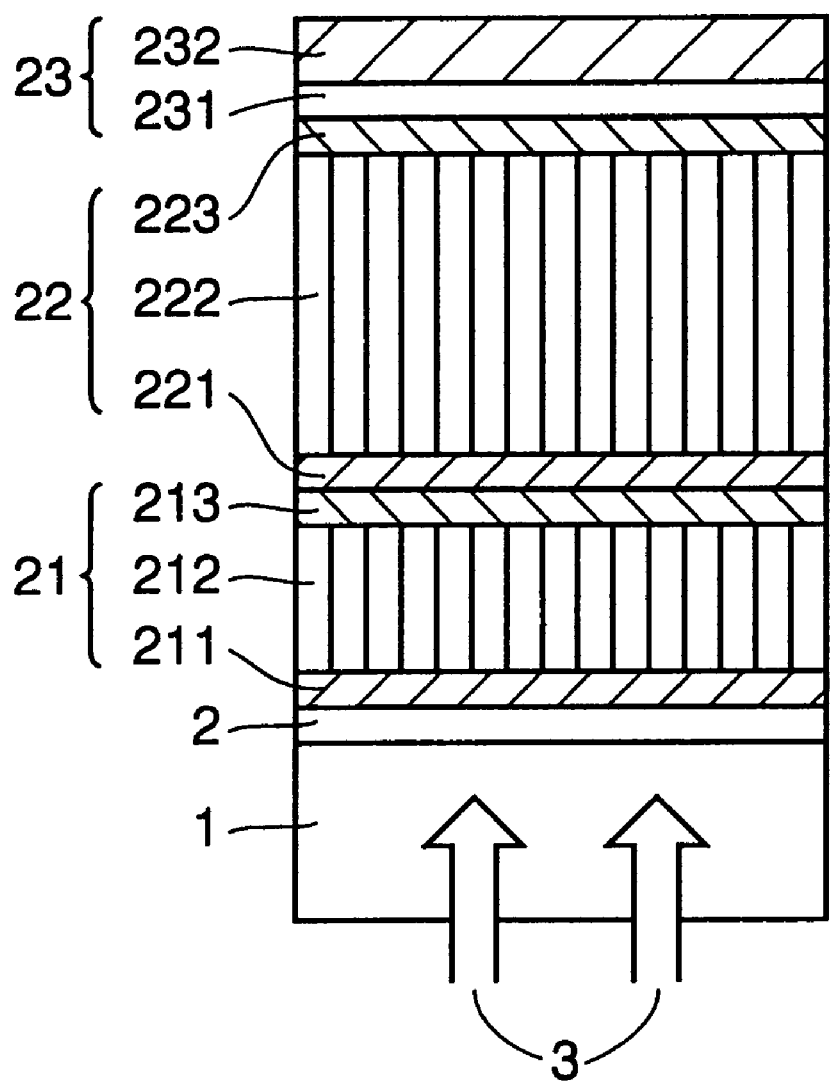
FIG. 3 is a schematic cross sectional view illustrating a structure of a silicon-based thin film photoelectric conversion device manufactured according to a method in another embodiment of the invention.
Figure 4:
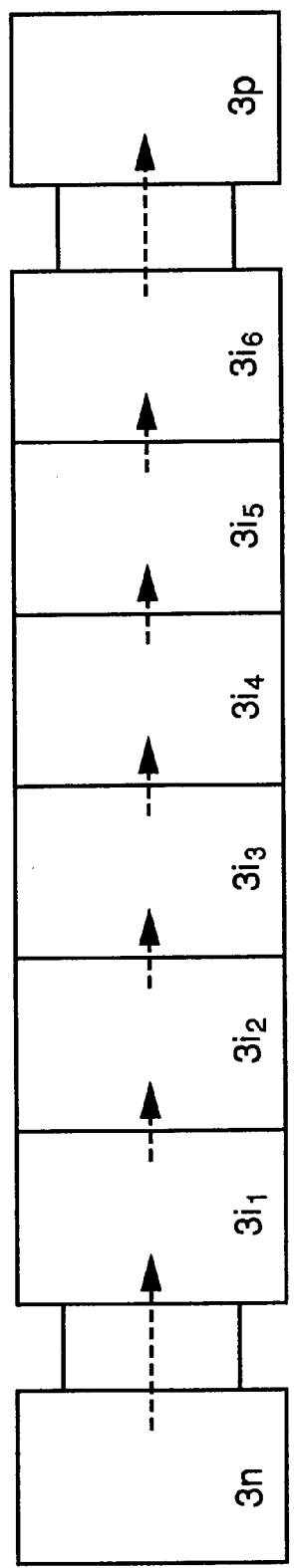
FIG. 4 is a block diagram illustrating a manufacturing apparatus of the in-line system employed in a conventional method of manufacturing a photoelectric conversion device.
Figure 5:
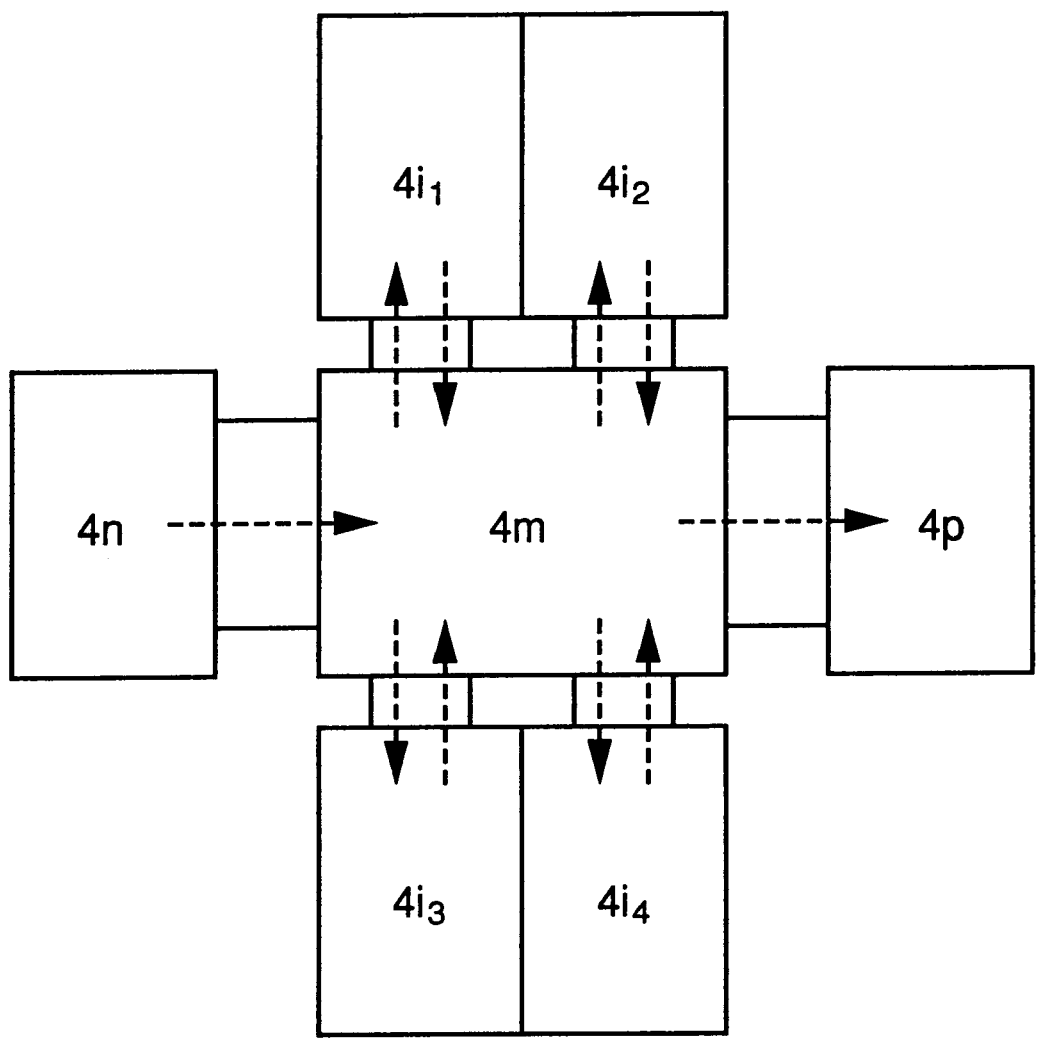
FIG. 5 is a block diagram illustrating a manufacturing apparatus of the multi-chamber system employed in a conventional method of manufacturing a photoelectric conversion device.

Referring to FIG. 3, a tandem type photoelectric conversion device has an amorphous type photoelectric conversion unit 21 and a crystalline type photoelectric conversion unit 22 formed on a substrate 1 via a transparent conducting film 2, and further has a conducting film 231 and a metal thin film 232 thereon to form a backside electrode portion 23.

Amorphous type photoelectric conversion unit 21 has a p type semiconductor layer 211, an i type amorphous photoelectric conversion layer 212, and an n type semiconductor layer 213. Crystalline type photoelectric conversion unit 22 has a p type semiconductor layer 221, an i type crystalline photoelectric conversion layer 222, and an n type semiconductor layer 223 that are formed by the method similar to that for photoelectric conversion unit 11 shown in FIG. 1.

Those structures except for that described above are almost similar to those described in conjunction with FIG. 1, and description thereof is not repeated here.

A result of an experiment conducted in this embodiment is now described.

EXPERIMENTAL EXAMPLE 1

A thin film polycrystalline silicon solar cell having the structure as shown in FIG. 1 was produced. Glass was employed as a substrate 1, and $SnO_2$ was employed as a transparent conducting film 2. On transparent conducting film 2, a boron-doped p type silicon layer 111 having a thickness of 15 nm, a non-doped i type polycrystalline silicon photoelectric conversion layer 112 having a thickness of 3 $\mu$m, and a phosphorus-doped n type silicon layer 113 having a thickness of 15 nm were respectively formed by RF plasma CVD. Accordingly, a thin film polycrystalline silicon photoelectric conversion unit 11 having a p-i-n junction was completed. As a backside electrode portion 12, a ZnO film 121 having a thickness of 100 nm and an Ag film 112 having a thickness of 300 nm were respectively produced by sputtering.

P, i and n type silicon thin films 111, 112 and 113 constituting photoelectric conversion unit 11 were deposited respectively by RF plasma CVD in the same reaction chamber. Silane and hydrogen were used as reaction gas, diborane was added as doping gas for depositing p type silicon layer 111, and phosphine was added as doping gas for depositing n type silicon layer 113. P type silicon layer 111 was formed on conditions that the temperature of an underlayer was 200° C., the ratio in flow rate of silane gas to hydrogen gas was 1:150, the pressure in the reaction chamber was 5.0 Torr, and the film deposition rate was 12 nm/min (film deposition time: 75 sec.). I type photoelectric conversion layer 112 and n type silicon layer 113 were deposited on conditions that the temperature of an underlayer was 200° C., the ratio in flow rate of silane gas to hydrogen gas was 1:100, the pressure in the reaction chamber was 5.0 Torr, and the film deposition rate was 15 nm/min.

When incident light 3 with a quantity of AM 1.5, 100 mW/cm$^2$ was applied to a thin film silicon solar cell produced as described above, the photoelectric conversion efficiency was 7.3%.

COMPARATIVE EXAMPLE 1

A thin film polycrystalline silicon solar cell having the structure shown in FIG. 1 was fabricated as Experimental Example 1. A p type silicon layer 111 was deposited on conditions that the temperature of an underlayer was 200° C., the ratio in flow rate of silane gas to hydrogen gas was 1:60, the pressure in the reaction chamber was 1.0 Torr, and the film deposition rate was 2.5 nm/min (deposition time 300 sec). Other conditions were identical to those of Experimental Example 1.

The photoelectric conversion efficiency of this thin film silicon solar cell was measured as Experimental Example 1, and the efficiency of 5.1% which was lower than that of Experimental Example 1 was obtained.

COMPARATIVE EXAMPLE 2

A thin film polycrystalline silicon solar cell having the same structure as that shown in FIG. 1 was produced as Experimental Example 1. The conditions were identical to those of Experimental Example 1, except that p type silicon layer 111, i type photoelectric conversion layer 112, and n type silicon layer 113 were formed respectively in separate reaction chambers.

The photoelectric conversion efficiency of this thin film silicon solar cell was measured as Experimental Example 1, and the efficiency was 7.4% which was almost the same as that obtained in Experimental Example 1. However, the total time required for producing one solar cell including the time for moving the substrate between reaction chambers was longer by about 10 minutes compared with that in Experimental Example 1.

EXPERIMENTAL EXAMPLE 2

A tandem type solar cell was manufactured by stacking a thin film polycrystalline silicon solar cell unit 22 formed by the method of Experimental Example 1 on an amorphous silicon solar cell unit 21 having the structure shown in FIG. 3. Measurement of the photoelectric conversion efficiency was made as in Experimental Example 1, and the resultant value was 13.0%.

REFERENTIAL EXAMPLE 1

A crystalline silicon thin film was manufactured by hydrogen plasma process as illustrated below.

An amorphous silicon thin layer was first deposited by RF plasma CVD. Silane was used as reaction gas, and pressure in a reaction chamber was set at 0.3 Torr. The temperature of the substrate was maintained at 150° C., RF power density was set at 15 mW/cm$^2$, and the thickness of the resultant amorphous silicon thin layer deposited in one deposition cycle was 350 nm.

The deposited amorphous silicon thin layer was exposed to RF hydrogen plasma and accordingly crystallized. Hydrogen was introduced into the RF plasma reaction chamber, and the pressure in the reaction chamber was accordingly increased to 5.0 Torr. The temperature of the substrate was still 150° C., and RF plasma power density was increased to 300 mW/cm$^2$. It took 8.0 seconds to expose the deposited amorphous silicon thin layer produced in one deposition cycle to RF hydrogen plasma to crystallize it.

The step of depositing the amorphous silicon thin layer and exposing it to RF hydrogen plasma to crystallize it was repeated 60 times. A crystalline silicon thin film having a thickness of approximately 2.1 μm was finally obtained. The crystalline silicon thin film was analyzed by ellipsometry. It was consequently confirmed that the crystallized volume fraction was 85% and thus the thin film is sufficiently crystallized as a silicon thin film.

As heretofore described, according to the present invention, a p type semiconductor layer, an i type photoelectric conversion layer, and an n type semiconductor layer that compose a photoelectric conversion unit are successively formed in a single chamber, and the p type semiconductor layer is formed on condition that the pressure in a reaction chamber is at least 5 Torr. Consequently, a method of manufacturing a silicon based thin film photoelectric conversion device is implemented to achieve an excellent photoelectric conversion efficiency, low cost, and a superior productivity.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a silicon-based thin film photoelectric conversion device having a stacked structure composed of a p type semiconductor layer, an i type crystalline silicon-based photoelectric conversion layer, and an n type semiconductor layer by plasma CVD, wherein said p type semiconductor layer, said i type crystalline silicon-based photoelectric conversion layer, and said n type semiconductor layer are successively deposited in the same plasma CVD reaction chamber, said p type semiconductor layer is formed under conditions that pressure in said reaction chamber is at least 5 Torr and that temperature of an underlayer is at most 550° C., silane-type gas as a main component of raw material gas which is supplied into said reaction component of raw material gas which is supplied into said reaction chamber and dilution gas containing hydrogen are used, and flow rate of said dilution gas is at least 100 times higher than that of said silane-type gas.

2. The method of manufacturing a silicon-based thin film photoelectric conversion device according to claim 1, wherein said p type semiconductor layer is formed to a thickness ranging from 2 nm to 50 nm, said i type crystalline silicon-based photoelectric conversion layer is formed to a thickness ranging from 0.5 μm to 20 μm, and said n type semiconductor layer is formed to a thickness ranging from 2 nm to 50 nm.

3. The method of manufacturing a silicon-based thin film photoelectric conversion device according to claim 1, wherein film deposition rate of said p type semiconductor layer is at least 12 nm/min.

4. The method of manufacturing a silicon-based thin film photoelectric conversion device according to claim 1, wherein conductivity type determining impurity atoms of said p type semiconductor layer are boron or aluminum.

5. A method of manufacturing a silicon-based thin film photoelectric conversion device having a stacked structure composed of a p type semiconductor layer, an i type crystalline silicon-based photoelectric conversion layer, and an n type semiconductor layer by plasma CVD, wherein said p type semiconductor layer, said i type crystalline silicon-based photoelectric conversion layer, and said n type semiconductor layer are successively deposited in the same plasma CVD reaction chamber, and said p type semiconductor layer is formed under condition that pressure in said reaction chamber is at least 5 Torr, and said i type crystalline silicon-based photoelectric conversion layer and said n type semiconductor layer are formed under conditions that pressure in said reaction chamber is at least 5 Torr, film deposition rate is at least 12 nm/min, temperature of an underlayer is at most 550° C., and flow rate of dilution gas is at least 100 times higher than that of silane-type gas.

6. The method of manufacturing a silicon-based thin film photoelectric conversion device according to claim 1, wherein at least one photoelectric conversion unit including an amorphous silicon-based photoelectric conversion layer is stacked in addition to at least one photoelectric conversion unit including said crystalline silicon-based photoelectric conversion layer to produce a tandem type photoelectric conversion device.

* * * * *